(12) United States Patent
Morita et al.

(10) Patent No.: US 10,297,975 B2
(45) Date of Patent: May 21, 2019

(54) LASER LIGHT SOURCE MODULE

(71) Applicant: MITSUBISHI ELECTRIC CORPORATION, Chiyoda-ku, Tokyo (JP)

(72) Inventors: Daisuke Morita, Tokyo (JP); Kazutaka Ikeda, Tokyo (JP); Motoaki Tamaya, Tokyo (JP)

(73) Assignee: MITSUBISHI ELECTRIC CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/758,605

(22) PCT Filed: Oct. 27, 2015

(86) PCT No.: PCT/JP2015/080207
§ 371 (c)(1),
(2) Date: Mar. 8, 2018

(87) PCT Pub. No.: WO2017/072849
PCT Pub. Date: May 4, 2017

(65) Prior Publication Data
US 2018/0278012 A1    Sep. 27, 2018

(51) Int. Cl.
*H01S 5/00*  (2006.01)
*H01S 5/022*  (2006.01)
(Continued)

(52) U.S. Cl.
CPC ...... *H01S 5/02252* (2013.01); *H01S 5/02236* (2013.01); *H01S 5/02272* (2013.01);
(Continued)

(58) Field of Classification Search
CPC ............. H01S 5/02272; H01S 5/02415; H01S 5/0425; H01S 5/40; H01S 5/4025;
(Continued)

(56) References Cited

U.S. PATENT DOCUMENTS 4,901,325 A    2/1990  Kato et al.
5,432,535 A    7/1995  Andrews et al.
(Continued)

FOREIGN PATENT DOCUMENTS

JP    63-237490 A    10/1988
JP    1-241504 A    9/1989
(Continued)

OTHER PUBLICATIONS

Office Action (Decision of Refusal) dated Jun. 5, 2018, by the Japanese Patent Office in corresponding Japanese Patent Application No. 2017-547225 and English translation of the Office Action. (7 pages).
(Continued)

*Primary Examiner* — Kinam Park
(74) *Attorney, Agent, or Firm* — Buchanan Ingersoll & Rooney PC (57) ABSTRACT

The purpose of the present invention is to provide a laser light source module that is capable of heat dissipation from a laser device and of suppressing the diffusion of a light beam due to the close arrangement of the laser device. The laser light source module comprises a stem that is a base plate and first and second laser assemblies disposed on the stem. Each of the laser assemblies comprises a multi-emitter LD bar that is a laser device emitting a laser light along an optical axis, and a holding member having a mounting surface parallel to the axis, the multi-emitter LD bar being mounted on the mounting surface. The first and second laser assemblies are positioned such that the optical axes of the assemblies are parallel to each other and that the mounting surfaces of the assemblies are arranged opposite to each other in parallel.

11 Claims, 6 Drawing Sheets

1   LD ASSEMBLY
2   STEM
3   CONDUCTIVE RIBBON
21  STEM BASE
22, 23  LEAD PIN (51) Int. Cl.
*H01S 5/024* (2006.01)
*H01S 5/40* (2006.01)
*H01S 5/042* (2006.01)

(52) U.S. Cl.
CPC ...... *H01S 5/02284* (2013.01); *H01S 5/02288* (2013.01); *H01S 5/02415* (2013.01); *H01S 5/02461* (2013.01); *H01S 5/02469* (2013.01); *H01S 5/0425* (2013.01); *H01S 5/40* (2013.01); *H01S 5/4025* (2013.01); *H01S 5/4031* (2013.01)

(58) Field of Classification Search
CPC ............. H01S 5/02284; H01S 5/02288; H01S 5/02236; H01S 5/02252; H01S 5/02461; H01S 5/02469; H01S 5/4031
See application file for complete search history.

(56) References Cited

U.S. PATENT DOCUMENTS

| | | | |
|---|---|---|---|
| 6,970,485 | B1 | 11/2005 | Kitayama et al. |
| 2002/0090172 | A1 | 7/2002 | Okazaki et al. |
| 2003/0048819 | A1 | 3/2003 | Nagano et al. |
| 2004/0233951 | A1 | 11/2004 | Moriya et al. |
| 2005/0286581 | A1* | 12/2005 | Shinohara ............. G11B 7/127 372/43.01 |
| 2007/0116073 | A1 | 5/2007 | Schulte et al. |
| 2008/0019010 | A1* | 1/2008 | Govorkov .......... B23K 26/0613 359/641 |
| 2009/0103581 | A1 | 4/2009 | Bessho |
| 2009/0147816 | A1 | 6/2009 | Iga et al. |
| 2010/0260226 | A1 | 10/2010 | Tamaya et al. |
| 2011/0096543 | A1 | 4/2011 | Yabe et al. |
| 2011/0149594 | A1* | 6/2011 | Terajima ............. G02B 6/0021 362/606 |
| 2012/0263200 | A1 | 10/2012 | Tamaya et al. |
| 2014/0284463 | A1 | 9/2014 | Kuroda et al. |

FOREIGN PATENT DOCUMENTS

| | | |
|---|---|---|
| JP | 6-222296 A | 8/1994 |
| JP | 11-4047 A | 1/1999 |
| JP | 2002-202442 A | 7/2002 |
| JP | 2002-316440 A | 10/2002 |
| JP | 2003-158332 A | 5/2003 |
| JP | 2004-77779 A | 3/2004 |
| JP | 2004-349294 A | 12/2004 |
| JP | 2007-19301 A | 1/2007 |
| JP | 2007-142439 A | 6/2007 |
| JP | 2009-124119 A | 6/2009 |
| JP | 2009-124186 A | 6/2009 |
| JP | 2009-141094 A | 6/2009 |
| JP | 2009-176764 A | 8/2009 |
| JP | 2011-96790 A | 5/2011 |
| JP | 2011-197360 A | 10/2011 |
| WO | WO 02/35666 A1 | 5/2002 |
| WO | WO 2009-081470 A1 | 7/2009 |
| WO | WO 2011/074262 A1 | 6/2011 |
| WO | WO 2013/065584 A1 | 5/2013 |

OTHER PUBLICATIONS

International Search Report (PCT/ISA/210) dated Jan. 26, 2016, by the Japanese Patent Office as the International Searching Authority for International Application No. PCT/JP2015/080207.

Office Action—Notification of Reasons for Refusal, Patent Application No. 2014-094689, dated Oct. 31, 2018, 9 pages, with English translation.

Office Action—Notification of Reasons for Refusal, Patent Application No. 2014-094689, dated Feb. 6, 2018, 5 pages, with English translation.

Office Action—Notification of Reasons for Refusal, Patent Application No. 2017-547225, dated Jan. 30, 2018, 5 pages, with English translation.

\* cited by examiner

Fig.1

1 LD ASSEMBLY
2 STEM
3 CONDUCTIVE RIBBON
21 STEM BASE
22, 23 LEAD PIN

Fig.2

11 MULTI-EMITTER LD BAR
12 METALLIZED PATTERN
13 HOLDING BLOCK
14 CONDUCTIVE WIRE

*Fig.3*

12a  ELECTRIC INSULATOR
12b, 12c, 12d  METALLIZED PATTERN

*Fig.4*

4  LENS
5  COVER
6  PELTIER DEVICE
7  POWER SOURCE

Fig.5

1A LD ASSEMBLY
2A STEM
3A CONDUCTIVE RIBBON
21A STEM BASE
22A LEAD PIN

Fig.6

32 SUB-MOUNT

Fig.7

32a ELECTRIC INSULATOR
32b, 32d METALLIZED PATTERN

Fig.8

8 ELECTRIC INSULATING PLATE

Fig.9

2B STEM
3B, 3C CONDUCTIVE RIBBON
21B STEM BASE
22B, 23B LEAD PIN

Fig.10

LASER LIGHT SOURCE MODULE

TECHNICAL FIELD

The present invention relates to a laser light source module having a plurality of laser devices such as LDs (laser diodes).

BACKGROUND ART

Optical apparatuses such as digital cinemas and projectors are required to have a lower cost and a power-saving property. Such an optical apparatus has a plurality of laser devices disposed therein as light source modules so as to achieve a necessary optical output. Use of optical coupling members such as optical fibers coupling light from modules in the optical apparatus is one of the factors determining the cost. Therefore, by increasing the optical output of a single module and reducing the number of laser devices in the optical device, the cost required for the optical coupling members can be reduced, and consequently, the cost per oscillation output of the optical apparatus can be lowered. This leads to a demand for a high-output type light source module having a high oscillation output as a single module.

Conventionally, for example, Patent Documents 1, 2 disclose a structure having a plurality of LD elements arranged in a uniaxial direction on the same plane and coupled to a fiber through two kinds of lenses so as to achieve a high optical output. However, since light-emitting points spread in the uniaxial direction (direction parallel to an emitter array), a divergence angle (etendue) of a synthesized optical beam becomes larger in the direction and, when a predetermined number of LD elements is exceeded, an optical coupling loss increases at the time of fiber coupling, causing a problem of reduced light emission efficiency.

Patent Documents 3, 4 disclose a package structure having a plurality of LD elements mounted on side surfaces of a common holding member in a module and thereby improving an optical output. However, since the structure of Patent Documents 3, 4 has the plurality of LD chips held by the one holding member, a distance between LD chips cannot be shortened, and a divergence angle (etendue) of an optical beam becomes larger in the uniaxial direction (the direction between the LD chips), an optical coupling loss increases at the time of fiber coupling, still causing a problem of reduced light emission efficiency.

Patent Document 5 discloses a package structure in which a plurality of LD chips is mounted in a module by using a stepped holding member. However, the stepped holding member makes it difficult to miniaturize a package as a whole.

PRIOR ART DOCUMENTS

Patent Documents

Patent Document 1: Japanese Laid-Open Patent Publication No. 2003-158332
Patent Document 2: Japanese Laid-Open Patent Publication No. 2002-202442
Patent Document 3: Japanese Laid-Open Patent Publication No. 6-222296
Patent Document 4: Japanese Laid-Open Patent Publication No. 2004-077779
Patent Document 5: Japanese Laid-Open Patent Publication No. 2007-142439

SUMMARY OF THE INVENTION

Problem to be Solved by the Invention

An object of the present invention is to provide a laser light source module capable of suppressing divergence of a light beam by close arrangement of laser devices while ensuring heat dissipation from the laser devices.

Means for Solving Problem

To achieve the object, a laser light source module according to the present invention comprises a base plate, and first and second laser assemblies disposed on the base plate; each of the laser assemblies includes a laser device emitting a laser light along an optical axis, and a holding member having a mounting surface parallel to the optical axis and the laser device mounted on the mounting surface; and the first and second laser assemblies are positioned such that the optical axis of the first laser assembly and the optical axis of the second laser assembly are parallel to each other and that the mounting surface of the first laser assembly and the mounting surface of the second laser assembly face each other in parallel.

Effect of the Invention

According to the present invention, since the mounting surface of the first laser assembly and the mounting surface of the second laser assembly face each other in parallel, the laser devices can closely be arranged. Therefore, a divergence angle (etendue) of a light beam synthesized from the laser lights emitted from the laser devices can be maintained small. Consequently, when the output light beam is coupled to an optical fiber, an optical coupling loss can be reduced.

Since the one holding block is disposed for each of the laser devices, a large junction area can be ensured between the holding block and the base plate and favorable heat transfer can be achieved from the laser devices to the base plate. Consequently, the light emission efficiency can be restrained from decreasing due to the heat generation of the laser devices. By mounting the laser devices having different wavelength bands on the first laser assembly and the second layer assembly, spatial beam power can be restrained from varying due to interference of light generated between two oscillation lights when the same wavelength band is used.

MODES FOR CARRYING OUT THE INVENTION

First Embodiment

Figure 1:
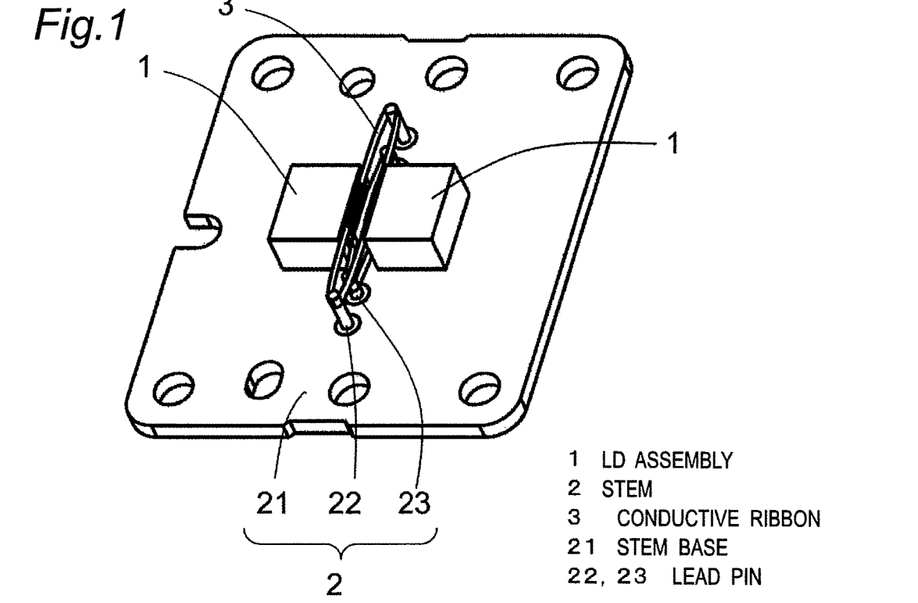
FIG. 1 is a perspective view of an example of a laser light source module according to a first embodiment of the present invention.
Figure 2:
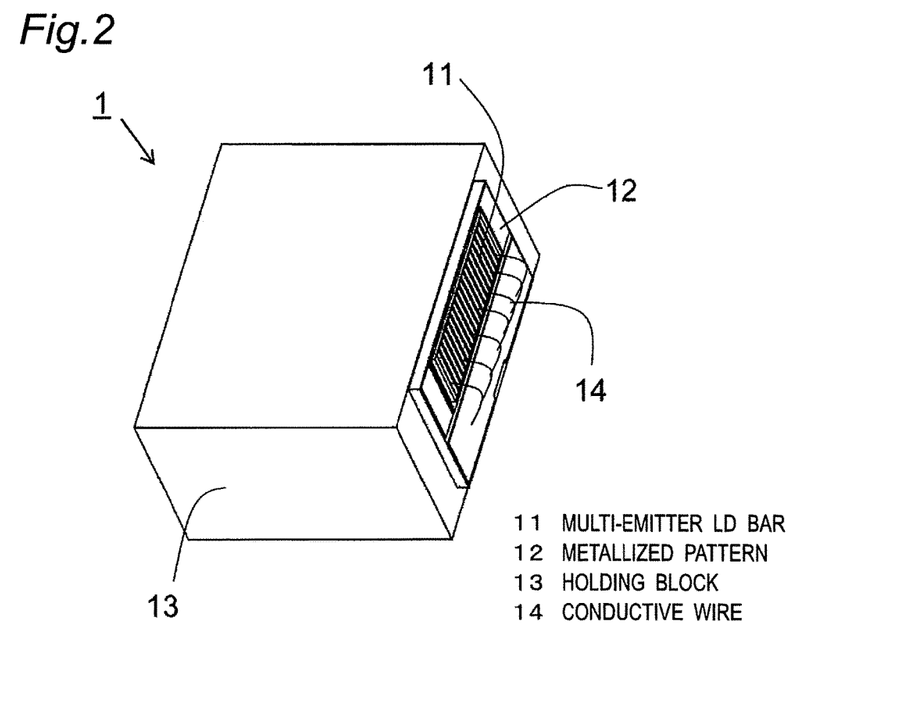
FIG. 2 is a perspective view of a configuration of an LD assembly.
Figure 3:
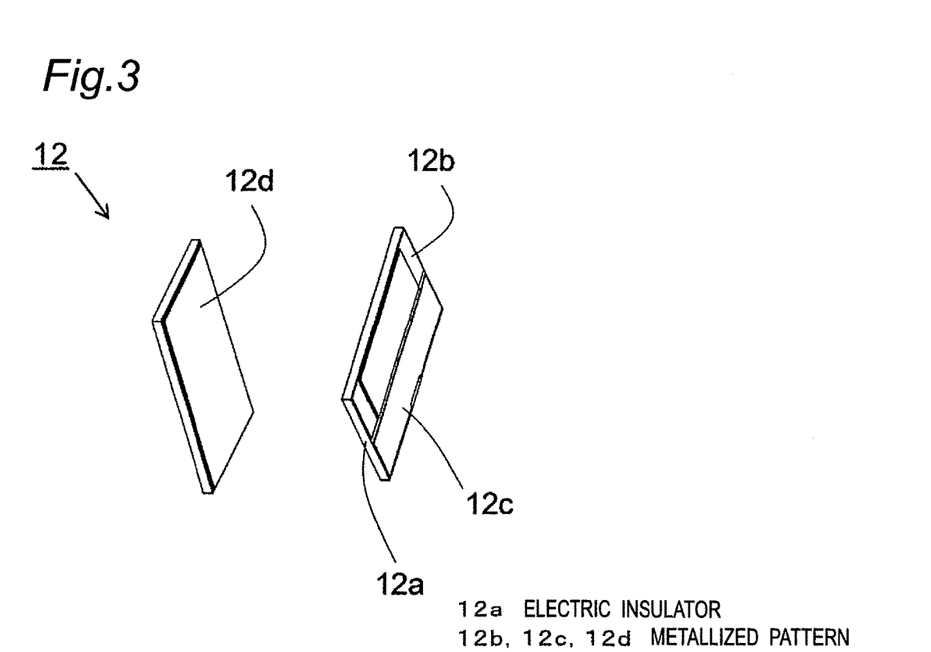
FIG. 3 is a perspective view of a configuration of a sub-mount.

A conventional technique is disclosed as a structure having a plurality of LD elements arranged in a uniaxial direction on the same plane and coupled to a fiber with two kinds of lenses so as to achieve a high optical output; however, since light-emitting points spread in the uniaxial direction (direction parallel to an emitter array), a divergence angle (etendue) of a synthesized optical beam becomes larger in the direction and, when a predetermined number of LD elements is exceeded, an optical coupling loss increases at the time of fiber coupling, causing a problem of reduced light emission efficiency. FIG. 1 is a perspective view of an example of a laser light source module according to a first embodiment of the present invention. FIG. 2 is a perspective view of a configuration of an LD assembly. FIG. 3 is a perspective view of a configuration of a sub-mount. The laser light source module comprises a stem 2 and two LD assemblies 1.

The stem 2 refers to a base plate responsible for a positioning function and a heat dissipation function of the LD assemblies 1 and includes a flat-plate stem base 21 and a plurality of lead pins 22, 23 penetrating the stem base 21. The lead pins 22, 23 are electrically insulated from the stem base 21, and generally, a low-melting-point glass is filled in gaps between holes of the stem base 21 and the lead pins 22, 23. The stem base 21 is an Au-plated material having a high thermal conductivity such as Cu, for example, and has through-holes formed for fixation.

Each of the LD assemblies 1 is responsible for an LD oscillation function and includes a multi-emitter LD bar 11, a sub-mount 12, and a holding block 13 as shown in FIG. 2.

The multi-emitter LD bar 11 is a laser diode having a plurality of light-emitting points linearly arranged on an end surface of a semiconductor chip of GaAs, AlGaN, etc., and a laser light is emitted from each of the light-emitting points along optical axis perpendicular to a chip end surface and parallel to a chip principal surface. A single common electrode is formed on the back surface of the chip, and a plurality of driving electrodes corresponding to the light-emitting points is formed on the front surface of the chip. Instead of the multi-emitter LD bar 11, a single emitter LD is usable. In this description, the multi-emitter LD bar 11 refers to a laser device.

The sub-mount 12 is responsible for an electric insulation function and a heat transfer function and made up of a flat-plate electric insulator 12a and has a plurality of metallized patterns 12b, 12c formed on the front surface of the electric insulator 12a and a metallized pattern 12d formed on the entire back surface of the electric insulator 12a as shown in FIG. 3. The two sub-mounts 12 to be mounted may have external dimensions different from each other.

The holding block 13 is responsible for an electric conduction function and the heat transfer function and is formed into a three-dimensional shape, for example, a rectangular parallelepiped shape, having a lower surface in contact with the stem base 21 and at least one side surface formed perpendicularly to this lower surface. This side surface acts as a mounting surface of a laser device and, in this embodiment, the multi-emitter LD bar 11 is mounted via the sub-mount 12. The sub-mount 12 is in contact with a front surface of the multi-emitter LD bar 11. In this state, the optical axis of the multi-emitter LD bar 11 is parallel to the mounting surface of the holding block 13 and perpendicular to the lower surface of the holding block 13 and the principal surfaces of the stem base 21. The light travels in parallel with the mounting surface of the holding block 13 toward the side opposite to the lower surface contacting the stem base 21 when viewed from the holding block 13. The lights emitted from the multi-emitter LD bars disposed on the two LD assemblies are in the same direction.

The holding block 13 is an Au-plated material having a high thermal conductivity such as Cu, for example, and is joined to the metallized pattern 12d of the sub-mount 12 by means of soldering. The metallized pattern 12b of the sub-mount 12 and the multi-emitter LD bar 11 are joined by means of soldering. Although the holding block 13 and the stem base 21 are joined by means of soldering, the solder preferably has a melting point lower than the solder used at the time of joining of the sub-mount 12.

The electric insulator 12a of the sub-mount 12 is made of a material having a high thermal conductivity, for example, a ceramic material such as silicon carbide (SiC), aluminum nitride (AlN), and alumina ($Al_2O_3$). In this case, when $\alpha1$, $\alpha2$, and $\alpha3$ are the thermal expansion coefficients of the multi-emitter LD bar 11, the sub-mount 12, and the holding block 13, respectively, it is preferable that $\alpha1 < \alpha2 < \alpha3$ be satisfied so as to relax a thermal stress generated at the time of solder bonding and to ensure durability against temperature fluctuation. The thermal expansion coefficients within the specified range reduce a stress generated due to a difference in thermal expansion coefficient between the members at the time of heating (such as solder bonding) of the multi-emitter LD bar 11, and a damage to the multi-emitter LD bar 11 can be reduced.

The metallized pattern 12c of the sub-mount 12 and the driving electrodes of the multi-emitter LD bar 11 are electrically connected by ultrasonic vibration pressure bonding by using conductive wires 14 of Au etc.

In this embodiment, before being joined to the stem base 21, the two LD assemblies 1 are positioned such that the optical axes of the multi-emitter LD bars 11 are parallel to each other and that the mounting surfaces of the multi-emitter LD bars 11 face each other in parallel, and are then finally fixed to the stem base 21. Since the front surfaces of the multi-emitter LD bars 11 are in contact, the back surfaces of the multi-emitter LD bars 11 disposed on the sub-mounts face each other.

Such a configuration enables close arrangement of the multi-emitter LD bars 11, so that a divergence angle (etendue) of a light beam synthesized from the laser lights emitted from the multi-emitter LD bars 11 can be maintained small. Consequently, when the output light beam is coupled to an optical fiber, an optical coupling loss can be reduced. By mounting respective laser devices having different wavelength bands on the two laser assemblies, spatial beam power can be restrained from varying due to interference of light generated between two oscillation lights when the same wavelength band is used.

Since the one holding block 13 is disposed for each of the multi-emitter LD bars 11, a large junction area can be ensured between the holding block 13 and the stem base 21 and favorable heat transfer can be achieved from the multi-emitter LD bar 11 to the stem base 21. Consequently, the multi-emitter LD bar 11 is increased in the heat dissipation efficiency, and the light emission efficiency can be restrained from decreasing due to the heat generation of the element.

In this embodiment, the two lead pins 23 are disposed at positions extended to both lateral sides from the center between the mounting surfaces of the LD assemblies 1, and the two lead pins 22 are disposed outside the lead pins 23. A conductive ribbon 3 of Au etc. is suspended and connected between the two lead pins 23 in a loop shape, and a portion of the loop is then electrically connected by ultrasonic vibration pressure bonding to each of the metallized patterns 12c of the sub-mounts 12 of the LD assemblies 1. Additionally, a conductive ribbon 3 of Au etc. is suspended and connected between the two lead pins 22 in a loop shape, and a portion of the loop is then electrically connected by ultrasonic vibration pressure bonding to each of the metallized patterns 12b of the sub-mounts 12 of the LD assemblies 1.

Figure 4:
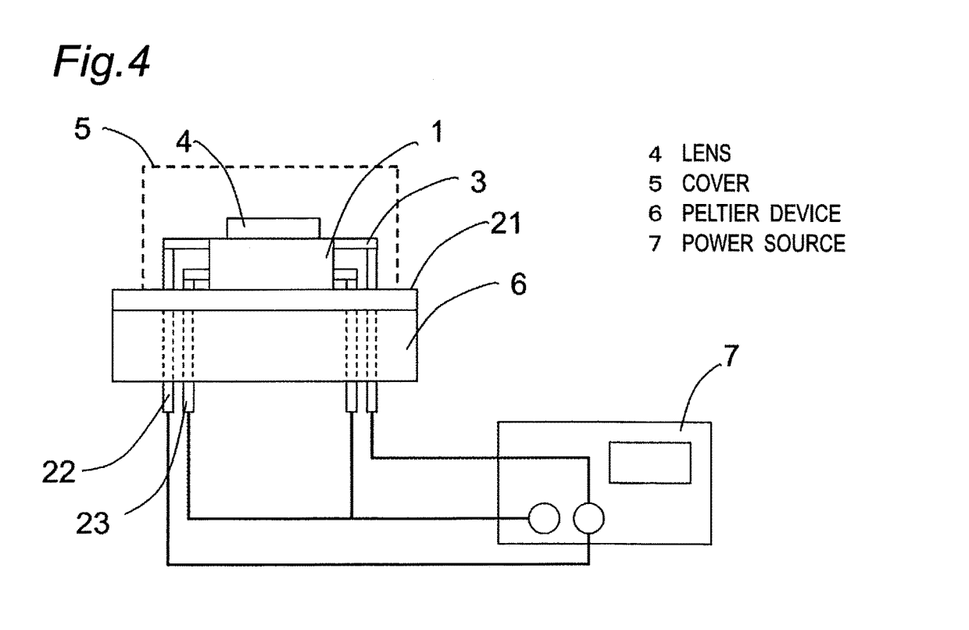
FIG. 4 is a configuration diagram of power feeding and heat dissipation of the laser light source module shown in FIG. 1.

FIG. 4 is a configuration diagram of power feeding and heat dissipation of the laser light source module shown in FIG. 1. If necessary, the laser light source module may be provided with a lens 4, for example, a condensing lens or a collimating lens, condensing the laser light from the multi-emitter LD bars 11, on each of the holding blocks 13, and may also be provided with a cover 5 surrounding the LD assemblies 1 on the stem base 21. The lens 4 can be fixed to the upper surface of the holding block 13 by using an adhesive, solder, etc. For prevention of dew condensation due to heat generation during use, it is desirable that the cover 5 is air-tightly fixed by using seam welding after nitrogen is sealed therein.

Regarding the power feeding, two output terminals of a power source 7 are respectively connected to the lead pins 22, 23 and, when a current is supplied from the power source 7, the multi-emitter LD bars 11 are energized and a laser light is emitted from each of the light-emitting points.

Regarding the heat dissipation, a heat sink is typically disposed under the stem base 21; however, as shown in FIG. 4, a Peltier device 6 capable of heat transport through energization may be disposed instead of the heat sink. A temperature sensor is disposed near the multi-emitter LD bars 11, and a temperature controller can provide feedback control of a drive current of the Peltier device 6 based on a signal from the temperature sensor so as to adjust the element temperature of the multi-emitter LD bars 11 to a desired value.

The lead pins 22, 23 are electrically insulated from the Peltier device 6. It is desirable to interpose an elastic sheet having a high thermal conductivity between the Peltier device 6 and the stem base 21 so as to reduce a thermal conduction loss due to a gap.

Second Embodiment

Figure 5:
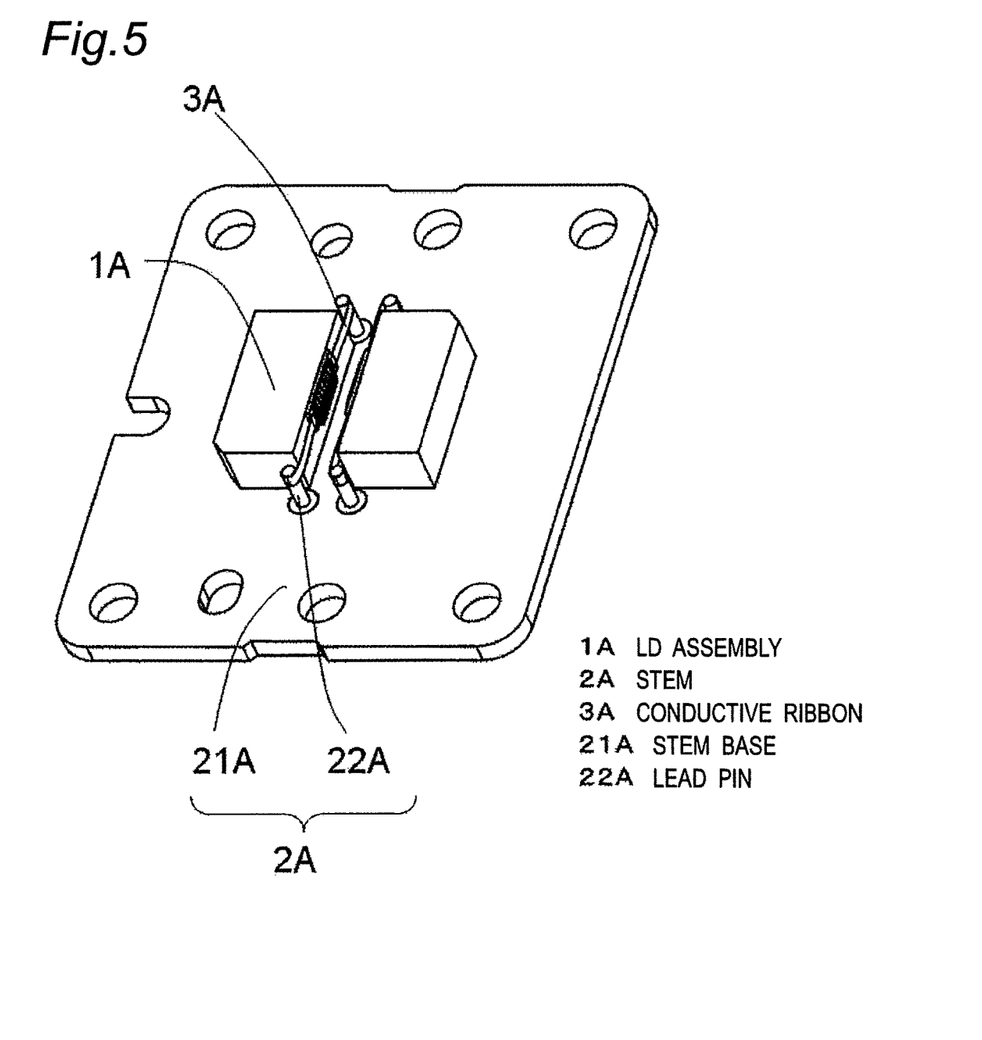
FIG. 5 is a perspective view of an example of a laser light source module according to a second embodiment of the present invention.
Figure 6:
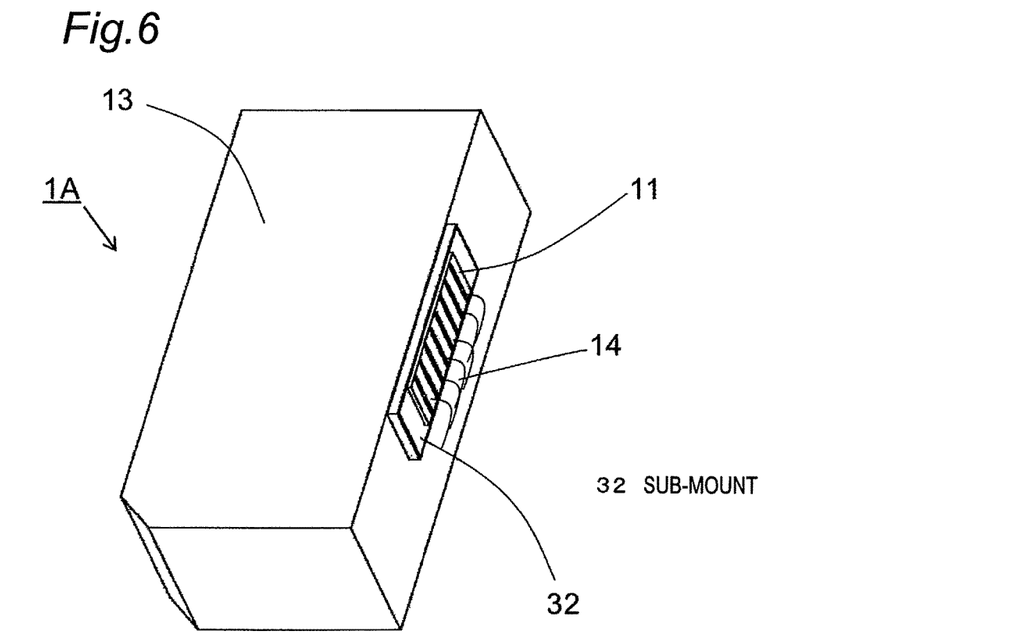
FIG. 6 is a perspective view of a configuration of an LD assembly.
Figure 7:
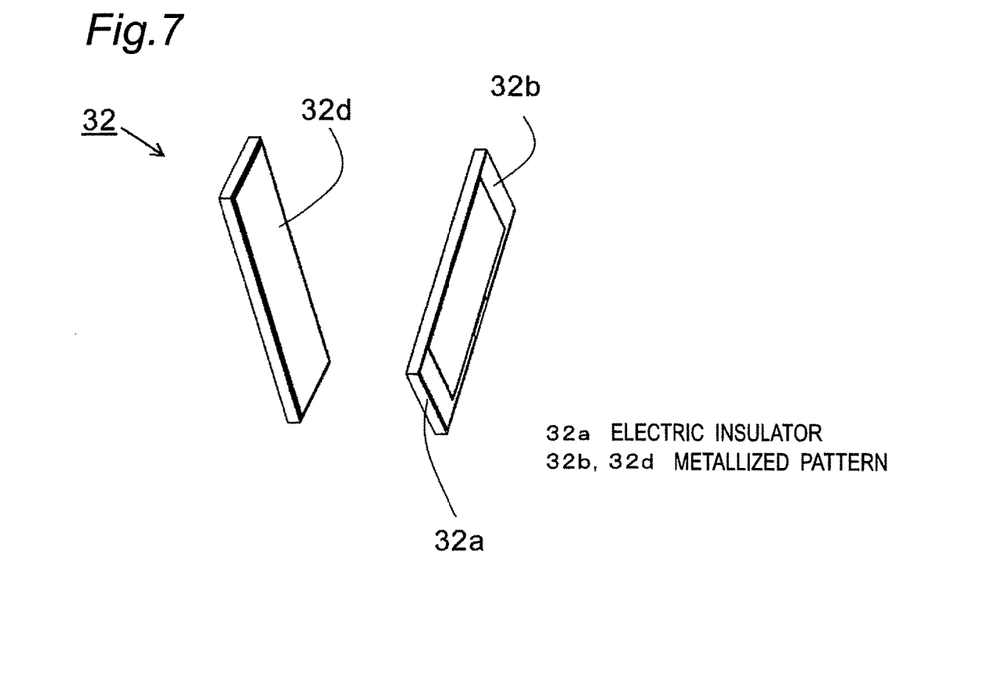
FIG. 7 is a perspective view of a configuration of a sub-mount.

FIG. 5 is a perspective view of an example of a laser light source module according to a second embodiment of the present invention. FIG. 6 is a perspective view of a configuration of an LD assembly. FIG. 7 is a perspective view of a configuration of a sub-mount. The laser light source module includes a stem 2A and two LD assemblies 1A.

The stem 2A refers to a base plate responsible for a positioning function and a heat dissipation function of the LD assemblies 1A and includes a flat-plate stem base 21A and a plurality of lead pins 22A penetrating the stem base 21A. The lead pins 22A are electrically insulated from the stem base 21A, and generally, a low-melting-point glass is filled in gaps between holes of the stem base 21A and the lead pins 22A. The stem base 21A is an Au-plated material having a high thermal conductivity such as Cu, for example, and has through-holes formed for fixation.

Each of the LD assemblies 1A is responsible for an LD oscillation function and includes the multi-emitter LD bar 11, a sub-mount 32, and the holding block 13 as shown in FIG. 6.

The multi-emitter LD bar 11 is a laser diode having a plurality of light-emitting points linearly arranged on an end surface of a semiconductor chip of GaAs, AlGaN, etc., and a laser light is emitted from each of the light-emitting points along optical axis perpendicular to a chip end surface and parallel to a chip principal surface. A single common electrode is formed on the back surface of the chip, and a plurality of driving electrodes corresponding to the light-emitting points is formed on the front surface of the chip. Instead of the multi-emitter LD bar 11, a single emitter LD is usable. In this description, the multi-emitter LD bar 11 refers to a laser device.

The sub-mount 32 is responsible for an electric insulation function and a heat transfer function and made up of a flat-plate electric insulator 32a and has a metallized patterns 32b formed on the front surface of the electric insulator 32a and a metallized pattern 32d formed on the entire back surface of the electric insulator 32a as shown in FIG. 7.

The holding block 13 is responsible for an electric conduction function and the heat transfer function and is formed into a three-dimensional shape, for example, a rectangular parallelepiped shape, having a lower surface in contact with the stem base 21A and at least one side surface formed perpendicularly to this lower surface. This side surface acts as a mounting surface of a laser device and, in this embodiment, the multi-emitter LD bar 11 is mounted via the sub-mount 32. The sub-mount 32 is in contact with the front surface of the multi-emitter LD bar 11. In this state, the optical axis of the multi-emitter LD bar 11 is parallel to the mounting surface of the holding block 13 and perpendicular to the lower surface of the holding block 13 and the principal surfaces of the stem base 21A. The light travels in parallel with the mounting surface of the holding block 13 toward the side opposite to the lower surface contacting the stem base 21A when viewed from the holding block 13. The lights emitted from the multi-emitter LD bars disposed on the two LD assemblies are in the same direction.

The holding block 13 is an Au-plated material having a high thermal conductivity such as Cu, for example, and is joined to the metallized pattern 32d of the sub-mount 32 by means of soldering. The metallized pattern 32b of the sub-mount 32 and the multi-emitter LD bar 11 are joined by means of soldering. Although the holding block 13 and the stem base 21A are joined by means of soldering, the solder preferably has a melting point lower than the solder used at the time of joining of the sub-mount 32.

The electric insulator 32a of the sub-mount 32 is made of a material having a high thermal conductivity, for example, a ceramic material such as silicon carbide (SiC), aluminum nitride (AlN), and alumina ($Al_2O_3$). In this case, when $\alpha 1$, $\alpha 2$, and $\alpha 3$ are the thermal expansion coefficients of the multi-emitter LD bar 11, the sub-mount 32, and the holding block 13, respectively, it is preferable that $\alpha 1 < \alpha 2 < \alpha 3$ be satisfied so as to relax a thermal stress generated at the time of solder bonding and to ensure durability against temperature fluctuation.

In this embodiment, the holding block 13 and the driving electrodes of the multi-emitter LD bar 11 are electrically connected by ultrasonic vibration pressure bonding by using conductive wires 14 of Au etc. By using the holding block 13 as a wiring member, the number of wirings using conductive ribbon can be reduced, which enables simplification inside a package and a reduction in the cost required for the wirings.

In this embodiment, before being joined to the stem base 21A, the two LD assemblies 1A are positioned such that the optical axes of the multi-emitter LD bars 11 are parallel to each other and that the mounting surfaces of the multi-emitter LD bars 11 face each other in parallel, and are then finally fixed to the stem base 21A. Since the front surfaces of the multi-emitter LD bars 11 are in contact, the back surfaces of the multi-emitter LD bars 11 disposed on the sub-mounts face each other.

Such a configuration enables close arrangement of the multi-emitter LD bars 11, so that a divergence angle (etendue) of a light beam synthesized from the laser lights emitted from the multi-emitter LD bars 11 can be maintained small. Consequently, when the output light beam is coupled to an optical fiber, an optical coupling loss can be reduced. By mounting respective laser devices having different wavelength bands on the two laser assemblies, spatial beam power can be restrained from varying due to interference of light generated between two oscillation lights when the same wavelength band is used.

Since the one holding block 13 is disposed for each of the multi-emitter LD bars 11, a large junction area can be ensured between the holding block 13 and the stem base 21A and favorable heat transfer can be achieved from the multi-emitter LD bar 11 to the stem base 21A. Consequently, the multi-emitter LD bar 11 is increased in the heat dissipation efficiency, and the light emission efficiency can be restrained from decreasing due to the heat generation of the element.

In this embodiment, the four lead pins 22A are disposed at positions extended to both lateral sides from the mounting surfaces of the LD assemblies 1A. A conductive ribbon 3A of Au etc. is suspended and connected between the two lead pins 22A on one side, and a portion of a loop is then electrically connected by ultrasonic vibration pressure bonding to the metallized pattern 32b of the sub-mount 32 of one of the LD assemblies 1. Additionally, a conductive ribbon 3A of Au etc. is suspended and connected between the two lead pins 22A on the other side, and a portion of a loop is then electrically connected by ultrasonic vibration pressure bonding to the metallized pattern 32b of the sub-mount 32 of the other of the LD assemblies 1.

Figure 8:
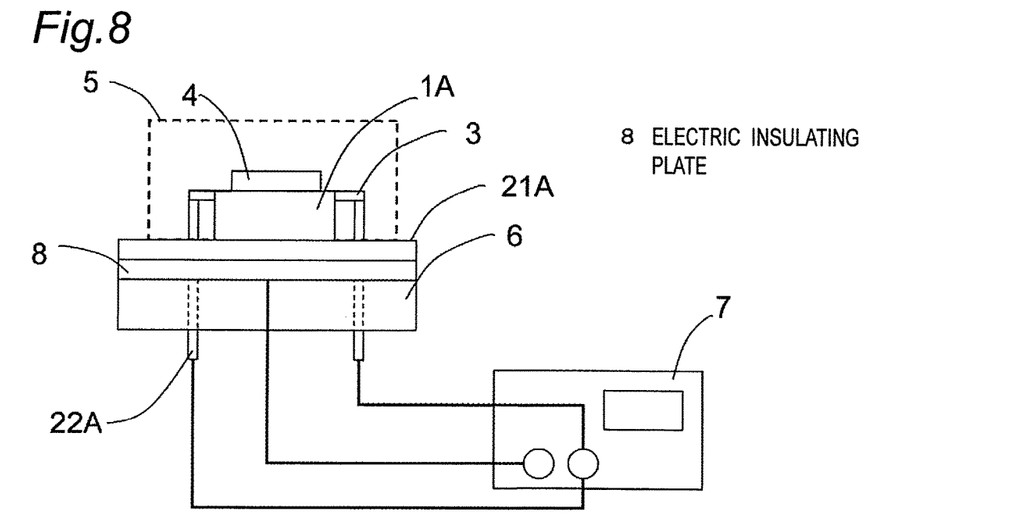
FIG. 8 is a configuration diagram of power feeding and heat dissipation of the laser light source module shown in FIG. 5.

FIG. 8 is a configuration diagram of power feeding and heat dissipation of the laser light source module shown in FIG. 5. If necessary, the laser light source module may be provided with the lens 4, for example, a condensing lens or a collimating lens, condensing the laser light from the multi-emitter LD bars 11, on each of the holding blocks 13, and may also be provided with the cover 5 surrounding the LD assemblies 1 on the stem base 21A. The lens 4 can be fixed to the upper surface of the holding block 13 by using an adhesive, solder, etc. For prevention of dew condensation due to heat generation during use, it is desirable that the cover 5 is air-tightly fixed by using seam welding after nitrogen is sealed therein.

Regarding the power feeding, two output terminals of the power source 7 are respectively connected to the lead pins 22A and the stem base 21A and, when a current is supplied from the power source 7, the multi-emitter LD bars 11 are energized and a laser light is emitted from each of the light-emitting points.

Regarding the heat dissipation, a heat sink is typically disposed under the stem base 21A; however, as shown in FIG. 8, the Peltier device 6 capable of heat transport through energization may be disposed instead of the heat sink. A temperature sensor is disposed near the multi-emitter LD bars 11, and a temperature controller can provide feedback control of a drive current of the Peltier device 6 based on a signal from the temperature sensor so as to adjust the element temperature of the multi-emitter LD bars 11 to a desired value.

The lead pins 22A are electrically insulated from the Peltier device 6. It is desirable to interpose an elastic sheet having a high thermal conductivity between the Peltier device 6 and the stem base 21A so as to reduce a thermal conduction loss due to a gap. An electric insulating plate 8 is interposed between the stem base 21A and the Peltier device 6 so as to ensure electric insulation. The electric insulating plate 8 is preferably a material having a high thermal conductivity.

Third Embodiment

Figure 9:
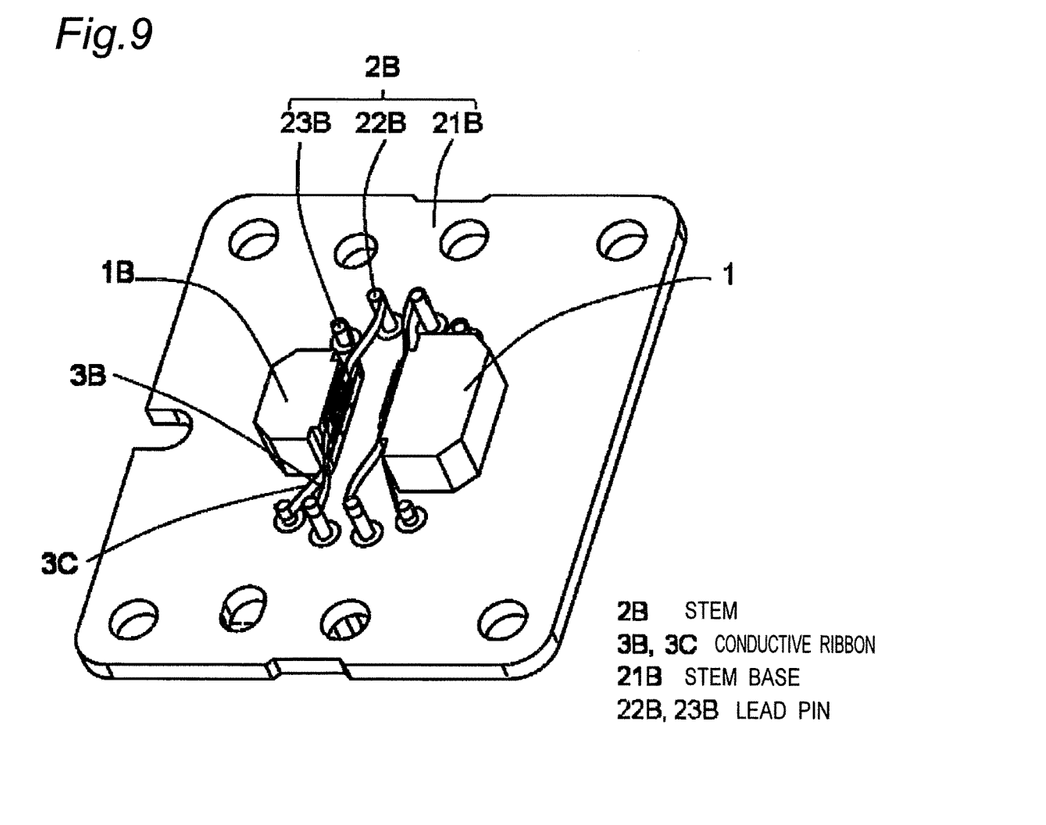
FIG. 9 is a perspective view of an example of a laser light source module according to a third embodiment of the present invention.

FIG. 9 is a perspective view of an example of a laser light source module according to a third embodiment of the present invention. In the third embodiment, a stem 2B refers to a base plate responsible for a positioning function and a heat dissipation function of the LD assemblies 1 and includes a flat-plate stem base 21B and a plurality of lead pins 22B, 23B penetrating the stem base 21B. A stem portion is different from those of the laser modules described in the first and second embodiments. The laser light source module includes the stem 2B and two LD assemblies 1, 1B. The two LD assemblies 1, 1B may have different outer dimensions as shown in FIG. 9.

The lead pins 22B, 23B are electrically insulated from the stem base 21B, and generally, a low-melting-point glass is filled in gaps between holes of the stem base 21B and the lead pins 22B, 23B. The stem base 21B is an Au-plated material having a high thermal conductivity such as Cu, for example, and has through-holes formed for fixation. In the third embodiment, the lead pins 22B are long while the lead pins 23B are short; however, this difference in the length of the lead pins is provided so as to connect conductive ribbons 3B, 3C to the upper and lower sides when the ribbons are connected from the lead pins 22B, 23B to the sub-mount, and the length is not limited as long as the conductive ribbons can be connected from the lead pins to the sub-mount.

The LD assembly 1 is responsible for an LD oscillation function and includes the multi-emitter LD bar 11, the sub-mount 12, and the holding block 13 as shown in FIG. 6. The two multi-emitter LD bars 11 to be mounted may be different in external dimensions and oscillation wavelength bands. The two sub-mounts 12 to be mounted may be have external dimensions different from each other. In this description, the multi-emitter LD bars 11 refer to laser devices. Since the LD assembly of the third embodiment is common to the LD assembly of the second embodiment and the third embodiment has a difference in the stem portion connected to the LD assembly 1, how this connection is made will be described. The other undescribed portions are assumed to be the same as the first and second embodiments.

The holding block 13 is responsible for a heat transfer function and is formed into a three-dimensional shape, for example, a rectangular parallelepiped shape, having a lower surface in contact with the stem base 21B and at least one side surface formed perpendicularly to this lower surface. This side surface acts as a mounting surface of a laser device and, in this embodiment, the multi-emitter LD bar 11 is mounted via the sub-mount 12. The sub-mount 12 is in contact with the front surface of the multi-emitter LD bar 11. In this state, the optical axis of the multi-emitter LD bar 11 is parallel to the mounting surface of the holding block 13 and perpendicular to the lower surface of the holding block 13 and the principal surfaces of the stem base 21B. The light travels in parallel with the mounting surface of the holding block 13 toward the side opposite to the lower surface contacting the stem base 21A when viewed from the holding block 13. The lights emitted from the multi-emitter LD bars disposed on the two LD assemblies are in the same direction. The two holding blocks 13 to be mounted may have external dimensions different from each other.

Although the holding block 13 and the stem base 21B are joined by means of soldering, the solder preferably has a melting point lower than the solder used at the time of joining of the sub-mount 12.

In the third embodiment, before being joined to the stem base 21B, the LD assemblies 1 are positioned such that the optical axes of the multi-emitter LD bars 11 are parallel to each other and that the mounting surfaces of the multi-emitter LD bars 11 face each other in parallel, and are then finally fixed to the stem base 21A. Since the front surfaces of the multi-emitter LD bars 11 are in contact, the back surfaces of the multi-emitter LD bars 11 disposed on the sub-mounts face each other.

Since the one holding block 13 is disposed for each of the multi-emitter LD bars 11, a large junction area can be ensured between the holding block 13 and the stem base 21B and favorable heat transfer can be achieved from the multi-emitter LD bar 11 to the stem base 21B. Consequently, the multi-emitter LD bar 11 is increased in the heat dissipation efficiency, and the light emission efficiency can be restrained from decreasing due to the heat generation of the element.

In the third embodiment, the eight lead pins 22B, 23B are disposed at positions extended to both lateral sides from the mounting surfaces of the two LD assemblies 1. The conductive ribbons 3B, 3C of Au etc. are suspended and connected between the two lead pins 22B in a loop shape on one side, and a portion of the loop is then electrically connected by ultrasonic vibration pressure bonding to the metallized pattern 12b of the sub-mount 12 of one of the LD assemblies 1. Additionally, the conductive ribbon 3C of Au etc. is suspended and connected between the two lead pins 23B on the other side, and a portion of the loop is then electrically connected by ultrasonic vibration pressure bonding to the metallized pattern 12c of the sub-mount 12 of the other of the LD assemblies 1.

Figure 10:
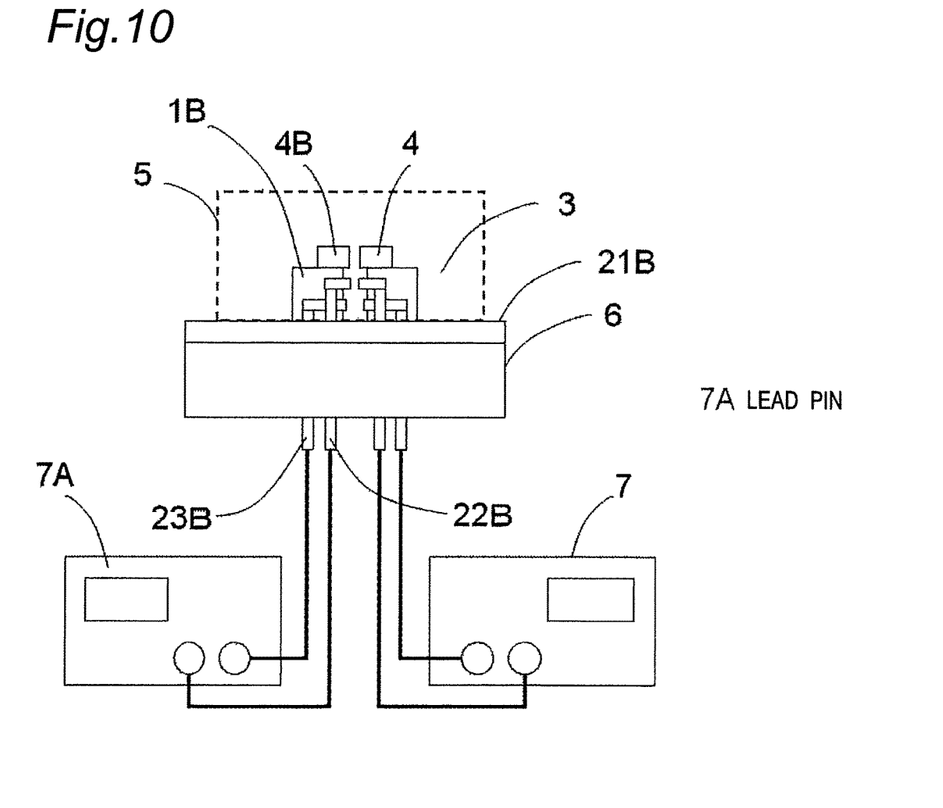
FIG. 10 is a configuration diagram of power feeding and heat dissipation of the laser light source module shown in FIG. 9.

FIG. 10 is a configuration diagram of power feeding and heat dissipation of the laser light source module shown in FIG. 9. If necessary, the laser light source module may be provided with the lens 4, for example, a condensing lens or a collimating lens, condensing the laser light from the multi-emitter LD bars 11, on each of the holding blocks 13, and may also be provided with the cover 5 surrounding the LD assemblies 1 on the stem base 21B. The lens 4 can be fixed to the upper surface of the holding block 13 by using an adhesive, solder, etc. For prevention of dew condensation due to heat generation during use, it is desirable that the cover 5 is air-tightly fixed by using seam welding after nitrogen is sealed therein.

Regarding the power feeding, two output terminals of each of power sources 7, 7A are connected to the respective lead pins 22B and 23B separately on the left and right of FIG. 9 and, when currents are supplied from the power sources 7, 7A, the two multi-emitter LD bars 11 are energized and a laser light is emitted from each of the light-emitting points. Specifically, the four long lead pins 22B and the four short lead pins 23B are present, and sets of the long lead pins 22B (two pins) and the short lead pins 23B (two pins) on the left and right of FIG. 9 are connected to the respective LD assemblies 1, 1B separately via the conductive ribbons 3B, 3C. The long lead pins 22B are electrically connected to anodes (positive poles) of the multi-emitter LD bars 11, and the short lead pins 23B are electrically connected to cathodes (negative poles) of the multi-emitter LD bars 11. In this case, anode surfaces and cathode surfaces of the two multi-emitter LD bars are electrically independent and not affected by each other. Therefore, the multi-emitter LD bars 11 can independently be supplied with currents, so that the multi-emitter LD bars 11 can be mounted even when the elements have different drive currents. Even if one of the multi-emitter LD bars 11 is damaged, the other one is electrically independent and therefore can be driven without being affected by the damaged element and an output can be acquired, so that the life as a module can be extended. A decrease in the output can be compensated by increasing the current applied to the other one.

Regarding the heat dissipation, a heat sink is typically disposed under the stem base 21B; however, as shown in FIG. 11, the Peltier device 6 capable of heat transport through energization may be disposed instead of the heat sink. A temperature sensor is disposed near the multi-emitter LD bars 11, and a temperature controller can provide feedback control of a drive current of the Peltier device 6 based on a signal from the temperature sensor so as to adjust the element temperature of the multi-emitter LD bars 11 to a desired value. The undescribed portions of this embodiment are assumed to be the same as the first and second embodiments.

EXPLANATIONS OF LETTERS OR NUMERALS 1, 1A LD assembly; 2, 2A, 2B stem; 3, 3A, 3B, 3C conductive ribbon; 4 lens; 5 cover; 6 Peltier device; 7, 7A power source; 8 electric insulating plate; 11 multi-emitter LD bar; 12, 32 sub-mount; 12a, 32a electric insulator; 12b, 12c, 12d, 32b, 32d metallized pattern; 13 holding block; 14 conductive wire; 21, 21A, 21B stem base; and 22, 23, 22A, 22B, 23B lead pin.

The invention claimed is:
1. A laser light source module comprising:
a base plate made of an Au-plated Cu and having a plurality of lead pins; and
first and second laser assemblies disposed on the base plate,
wherein each of the laser assemblies comprises:
a laser device emitting a laser light along an optical axis;
an electrically-insulating sub-mount; and
a holding member made of an Au-plated Cu and having a mounting surface parallel to the optical axis, the laser device being mounted on the mounting surface such that the sub-mount is interposed between the laser device and the mounting surface,
wherein a plurality of metallized patterns are formed on the sub-mount, wherein the laser device is joined to the first metallized pattern by soldering, wherein the laser device has a driving electrode electrically connected through a wire to the second metallized pattern, wherein the first and second metallized patterns are electrically connected through conductors to the first and second lead pins respectively, and wherein the first and second laser assemblies are positioned such that the optical axes of the first and second laser assemblies are parallel to each other and that the mounting surfaces of the first and second laser assemblies are arranged opposite to and in proximity to each other in parallel.

2. A laser light source module comprising:

a base plate made of an Au-plated Cu and having a plurality of lead pins; and first and second laser assemblies disposed on the base plate, wherein each of the laser assemblies comprises:

a laser device emitting a laser light along an optical axis;

an electrically-insulating sub-mount; and a holding member made of an Au-plated Cu and having a mounting surface parallel to the optical axis, the laser device being mounted on the mounting surface such that the sub-mount is interposed between the laser device and the mounting surface, wherein a metallized pattern is formed on the sub-mount, wherein the laser device is joined to the metallized pattern by soldering, wherein the laser device has a driving electrode electrically connected through a wire to the holding member, wherein the metallized pattern is electrically connected through a conductor to the lead pins, and wherein the first and second laser assemblies are positioned such that the optical axes of the first and second laser assemblies are parallel to each other and that the mounting surfaces of the first and second laser assemblies are arranged opposite to and in proximity to each other in parallel.

3. A laser light source module comprising:

a base plate made of an Au-plated Cu and having a plurality of lead pins; and first and second laser assemblies disposed on the base plate, wherein each of the laser assemblies comprises:

a laser device emitting a laser light along an optical axis;

an electrically-insulating sub-mount; and a holding member made of an Au-plated Cu and having a mounting surface parallel to the optical axis, the laser device being mounted on the mounting surface such that the sub-mount is interposed between the laser device and the mounting surface, wherein a metallized pattern is formed on the sub-mount, wherein the laser device is joined to the metallized pattern by soldering, wherein the laser device has a driving electrode electrically connected through a wire to the holding member, wherein the metallized pattern is electrically connected through a conductor to the lead pins, wherein the first and second laser assemblies are positioned such that the optical axes of the first and second laser assemblies are parallel to each other and that the mounting surfaces of the first and second laser assemblies are arranged opposite to and in proximity to each other in parallel, wherein the laser devices mounted on the first and second laser assemblies have anodes and cathodes respectively electrically connected to the lead pins and are thereby electrically insulated between the laser devices, and wherein the lead pins connected to the laser device mounted on the first laser assembly and the lead pins connected to the laser device mounted on the second laser assembly are respectively connected to two power sources to enable the laser devices to independently oscillate.

4. The laser light source module according to claim 1, wherein when $\alpha 1$, $\alpha 2$, and $\alpha 3$ are the thermal expansion coefficients of the laser device, the sub-mount, and the holding member, respectively, $\alpha 1 < \alpha 2 < \alpha 3$ is satisfied.

5. The laser light source module according to claim 2, wherein when $\alpha 1$, $\alpha 2$, and $\alpha 3$ are the thermal expansion coefficients of the laser device, the sub-mount, and the holding member, respectively, $\alpha 1 < \alpha 2 < \alpha 3$ is satisfied.

6. The laser light source module according to claim 1, wherein the laser device is a laser diode having a plurality of light-emitting points.

7. The laser light source module according to claim 2, wherein the laser device is a laser diode having a plurality of light-emitting points.

8. The laser light source module according to claim 3, wherein the laser device is a laser diode having a plurality of light-emitting points.

9. The laser light source module according to claim 1 further comprising:

an elastic sheet having a high thermal conductivity; and a heat sink or Peltier device for cooling the first and second laser assemblies, wherein the base plate is mounted on the heat sink or Peltier device such that the elastic sheet is interposed between the base plate and the heat sink or Peltier device.

10. The laser light source module according to claim 2 further comprising:

an elastic sheet having a high thermal conductivity; and a heat sink or Peltier device for cooling the first and second laser assemblies, wherein the base plate is mounted on the heat sink or Peltier device such that the elastic sheet is interposed between the base plate and the heat sink or Peltier device.

11. The laser light source module according to claim 3 further comprising:

an elastic sheet having a high thermal conductivity; and a heat sink or Peltier device for cooling the first and second laser assemblies, wherein the base plate is mounted on the heat sink or Peltier device such that the elastic sheet is interposed between the base plate and the heat sink or Peltier device.

* * * * *